United States Patent [19]

Sink et al.

[11] Patent Number: 4,661,324
[45] Date of Patent: Apr. 28, 1987

[54] APPARATUS FOR REPLENISHING A MELT

[75] Inventors: Nicholas C. Sink, Stoughton; Myer Rogers, Randolph, both of Mass.

[73] Assignee: Mobil Solar Energy Corporation, Waltham, Mass.

[21] Appl. No.: 702,342

[22] Filed: Feb. 15, 1985

[51] Int. Cl.⁴ .............................................. C30B 15/34
[52] U.S. Cl. .................................. 422/246; 156/608; 422/249
[58] Field of Search ......... 156/608, 617 SP, DIG. 83, 156/DIG. 88; 198/638; 222/336, 340; 414/165; 422/245–249

[56] References Cited

U.S. PATENT DOCUMENTS

| 2,419,770 | 4/1947 | Glass | 273/129 S |
|---|---|---|---|
| 3,591,348 | 7/1971 | Belle | 422/249 X |
| 3,687,633 | 8/1972 | La Belle et al. | 156/608 X |
| 4,230,674 | 10/1980 | Taylor et al. | 156/DIG. 88 |
| 4,440,728 | 4/1984 | Stormont et al. | 422/246 |

FOREIGN PATENT DOCUMENTS 1240825 5/1967 Fed. Rep. of Germany ...... 156/617 SP

Primary Examiner—Barry S. Richman
Assistant Examiner—Michael S. Gzybowski
Attorney, Agent, or Firm—Schiller, Pandiscio & Kusmer

[57] ABSTRACT

Apparatus for replenishing a melt while a crystal growing operation is in process. The apparatus comprises an elongated hollow housing member having an open top end and a closed bottom end. A vertically movable support means for supporting a charge of source material, to be added to the melt, is located within the hollow housing member. The apparatus further comprises a conduit means for delivering a predetermined charge of source material to the support means. A charge of source material is delivered to the melt by operation of a retractor means that retracts the support means downwardly within the hollow housing member against the force of a spring means that yieldingly biases the support means upwardly within the hollow housing member towards the open top end of the hollow housing member. When the support means reaches a predetermined release point in its downward motion, the retractor means automatically releases the support means to the force of the spring means. Under the force of the spring means, the support means moves rapidly upward within the hollow housing member until it hits a stop means at which moment the charge of source material is projected into a deflector member which deflects the charge into the melt.

9 Claims, 8 Drawing Figures

APPARATUS FOR REPLENISHING A MELT

FIELD OF THE INVENTION

This invention relates generally to apparatus for growing crystalline bodies from a melt, and more particularly to apparatus for replenishing a melt.

BACKGROUND OF THE INVENTION

Various methods have been developed for growing crystalline bodies from a melt. One such method is known as the Edge-defined, Film-fed Growth technique (also commonly called the EFG Process). Details of the EFG Process are described and illustrated in U.S. Pat. No. 3,591,348 issued July 6, 1971 to Harold E. LaBelle, Jr. for "Method Of Growing Crystalline Materials", and in U.S. Pat. No. 3,687,633 issued Aug. 29, 1972 to Harold E. LaBelle, Jr. et al. for "Apparatus For Growing Crystalline Bodies From The Melt".

In the EFG Process, a capillary-forming die member is placed in association with a melt of liquid source material so that a growth face on the die member is wetted with a liquid film of source material from the melt by capillary action. A product crystalline body is then grown by first introducing a seed crystal to the liquid film of source material so that crystal formation is initiated, and then drawing the seed crystal away from the growth face at a controlled rate so that the liquid film of source material remains sandwiched between the growing crystalline body and the growth face of the die member. Since the liquid film of source material on the die's growth face is continuously replenished from the melt via the die's capillary (or capillaries), continuous crystalline bodies of significant size may be grown from the melt.

One consequence of the foregoing process is that the liquid source material in the melt is consumed during the crystal growing operation. Accordingly, unless melt replenishment can be effected while crystal growth is under way, the crystal growing operation must be shut down after a period of time to permit the depleted melt to be replenished with additional source material.

Unfortunately, shutting down the crystal growing operation from time to time to replenish the melt raises certain problems. More particularly, shutting down (and starting up) an EFG crystal growing operation is time-consuming and expensive. In addition, the maximum length of continuous crystal which can be grown in a given system is limited in an absolute sense by the frequency with which the crystal growing operation must be shut down to replenish the melt. Furthermore, starting up and shutting down a crystal growing operation requires the crystal growing system to settle into or depart from the optimum crystal growing conditions. During this period of system adjustment, the crystal grown may be of inferior quality to that normally produced.

For these and other reasons, it is preferred that replenishment shutdowns occur as infrequently as possible. Unfortunately, attempts to reduce the frequency of replenishment shutdowns by simply increasing the size of the crucible which holds the melt (and hence the maximum quantity of source material contained in the melt at startup) have been hampered by design considerations for adjacent equipment components.

Attempts have also been made to effect melt replenishment while crystal growth is under way. Such "growth-time" replenishments offer the additional advantage that they may keep the melt level constant, or at least somewhat more constant, during crystal growth. This is important, since it facilitates growing high quality crystalline bodies. Unfortunately, such attempts at effecting melt replenishment while crystal growth is under way have not been fully satisfactory for one or more reasons, including excessive perturbation of the melt as additional source material enters the crucible, lack of reliability, excessive size, high cost, and/or complication of the design of adjacent equipment components.

OBJECTS OF THE INVENTION

Accordingly, the principal object of the present invention is to provide novel apparatus for replenishing a melt which is adapted to operate while a crystal growing operation is under way, so that the crystal growing operation can continue without interruption for longer periods of time.

Another object of the invention is to provide novel melt replenishment apparatus which is adapted to replenish the melt at substantially the same rate at which the melt is consumed during a crystal growing operation, in order that the melt level in the crucible may be kept substantially constant during crystal growth to facilitate growing high quality crystal.

Yet another object is to provide novel apparatus for replenishing a melt which is simple to construct, inexpensive to produce, and reliable to operate.

A further object is to provide novel melt replenishment apparatus which can be used in conjunction with apparatus for growing crystalline bodies according to the EFG Process, as well as in conjunction with apparatus for growing crystalline bodies according to other processes.

And another object is to provide novel apparatus for replenishing a melt which is adapted to operate from a position inside a hollow crystalline body as the body is being grown from the melt.

Still another object is to provide a novel melt replenishment apparatus for use with a conventional crystal growing furnace in which a predetermined gaseous environment must be maintained.

SUMMARY OF THE INVENTION

These and other objects are achieved by the present invention which provides novel apparatus for replenishing a melt, wherein the novel apparatus comprises:

(a) an elongate hollow housing having a top end and a bottom end, with the top end being open;

(b) support means for supporting a charge of source material which is to be added to the melt, the support means being adapted for vertical movement within the hollow housing;

(c) conduit means for delivering a predetermined charge of source material to the support means;

(d) spring means for yieldably biasing the support means upward within the housing towards the housing's open top end;

(e) stop means for preventing the support means from passing out the top end of the housing; and (f) retractor means for retracting the support means on command downward within the housing against the force of the spring means until the support means reaches a predetermined release point, whereupon the retractor means will automatically release the support means to the force of the spring means.

The foregoing apparatus is mounted in the crystal growing apparatus so that the hollow housing extends upward through an opening in the crucible, with the open top end of the housing being positioned above the surface of the liquid melt in the crucible. When it is desired to replenish the melt with additional source material, a predetermined charge of source material is delivered to the support means, and then the retractor means is activated to retract the support means and its charge of source material downward within the housing against the force of the spring means. When the support means reaches the predetermined release point, the retractor means automatically releases the support means so that the spring means propels the support means and its charge of source material upward within the housing. The support means and source material move upward within the housing until the support means encounters the stop means, whereupon upward movement of the support means is abruptly terminated. The sudden deceleration of the support means and the inertia of the charge of source material causes the source material to separate from the support means and continue to move upward in the hollow housing and to pass out of the open top end of the housing, whereupon it falls down into the crucible so as to replenish the melt.

BRIEF DESCRIPTION OF THE DRAWINGS

These and other objects and features of the present invention will be more fully disclosed or rendered obvious in the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
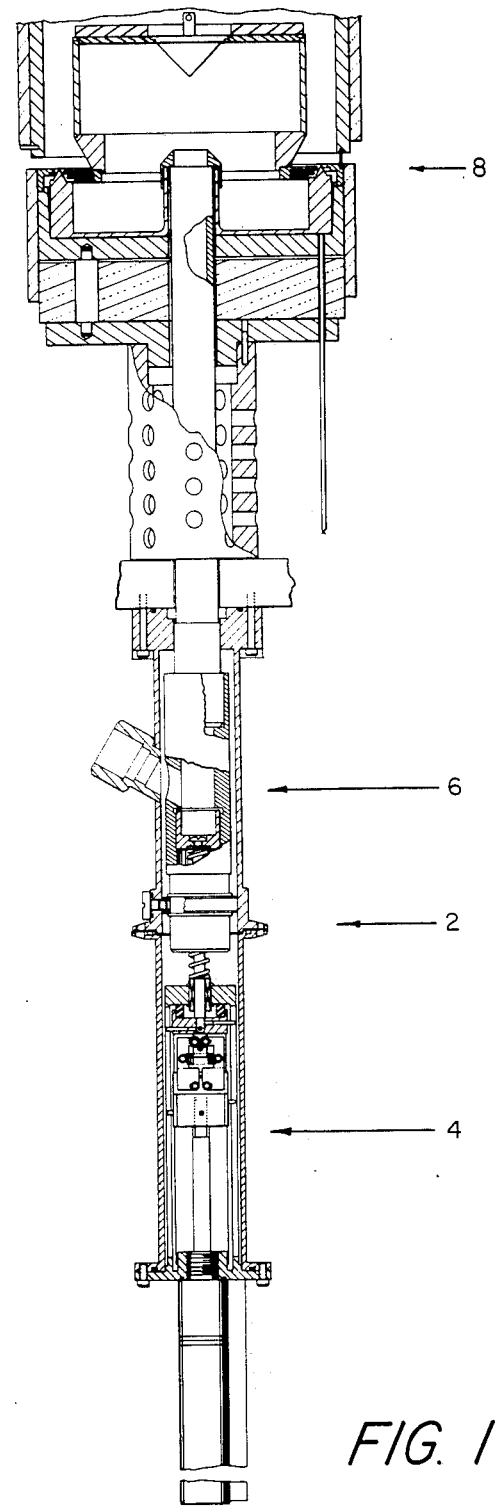
FIG. 1 is a partial side elevational view partially in section showing the preferred embodiment of the novel apparatus for replenishing a melt, with the apparatus being shown in association with apparatus for growing crystalline bodies according to the EFG Process.

Looking first at FIG. 1, the preferred embodiment of the present invention comprises a melt replenishing apparatus 2 which in turn comprises a chip thruster assembly 4 and a base plate assembly 6.

Chip thruster assembly 4 is shown in detail in FIGS. 2, 2A, 3, 4 and 4A. Looking first at FIG. 2, chip thruster assembly 4 generally comprises a frame or skeleton subassembly 100, a chip carrier subassembly 200, and a retractor subassembly 300.

Figure 2:
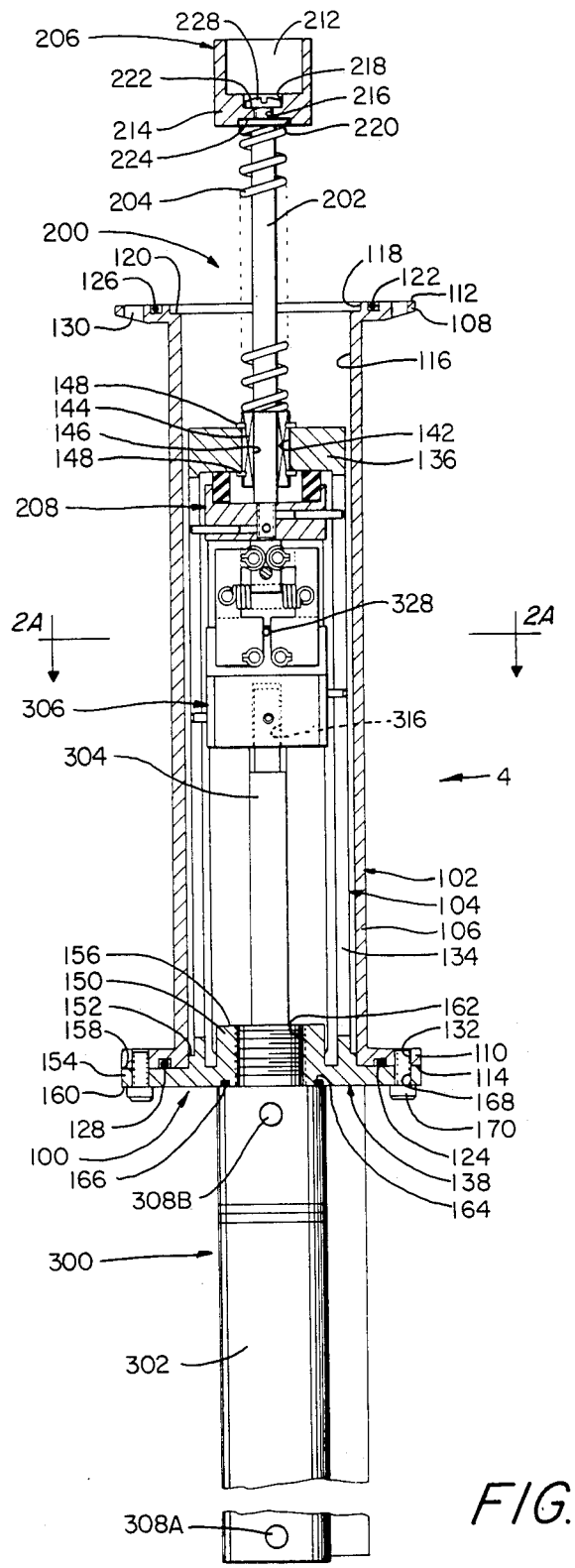
FIG. 2 is an enlarged partial side elevational view partially in section showing the preferred embodiment's chip thruster assembly, with the chip thruster assembly's chip carrier subassembly being shown in its first extended position.
Figure 2A:
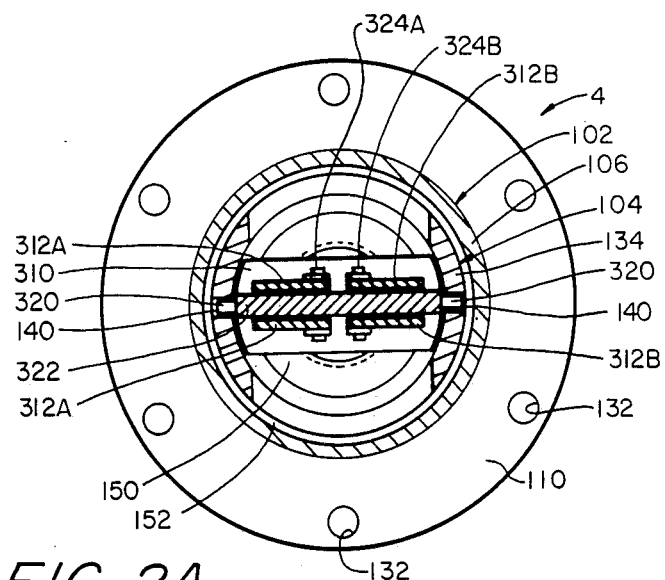
FIG. 2A is a sectional view taken along line 2A—2A of FIG. 2.

Looking next at FIGS. 2 and 2A, frame subassembly 100 comprises an outer thruster sleeve 102 and an inner retractor cage 104. Sleeve 102 comprises a cylindrical body section 106, an upper flange 108 and a lower flange 110. Flanges 108 and 110 are preferably, though not necessarily, formed integral with body section 106, and they terminate in flat upper and lower end surfaces 112 and 114, respectively. The axial bore 116 defined by the inner surface of body section 106 intersects a counterbore 118 formed in upper flange 108. A shoulder 120 is formed at the intersection of bore 116 and counterbore 118. Circular grooves 122 and 124 are provided in the end surfaces 112 and 114, respectively, to accommodate resilient O-ring seals 126 and 128 respectively. The latter are sized so as to protrude slightly from grooves 122 and 124. A plurality of threaded vertical holes 130 and 132 pass through upper and lower flanges 108 and 110, respectively.

Still looking at FIGS. 2 and 2A, retractor cage 104 is disposed inside of thruster sleeve 102. Retractor cage 104 comprises a pair of side risers 134 which are connected at their top ends by a crossbar 136 and at their bottom ends by a base 138. Each of the side risers has a longitudinal slot 140 (FIG. 2A) formed therein. Crossbar 136 is preferably, though not necessarily, formed as a separate member which is secured to side risers 134 by suitable means. Crossbar 136 has a smooth opening 142 formed in its center. A bearing unit 144 having a central opening 146 is held in the crossbar's opening 142 by a pair of snap rings 148. The retractor cage's base 138 is preferably, though not necessarily, formed integral with side risers 134, and has a stepped cross-sectional profile. More particularly, base 138 includes a central plug section 150, a step 152, and a flange 154. Plug section 150 terminates in an upper surface 156, and flange 154 has an upper surface 158 and a lower surface 160. A threaded central bore 162 extends through base 138. Bore 162 is axially aligned with the crossbar's opening 142. A circular bottom groove 164 is provided in the base's lower surface 160, concentric to central bore 162, and a resilient O-ring seal 166 is disposed in and protrudes slightly outward from groove 164. A plurality of threaded vertical holes 168 pass through the base's flange 154.

Outer thruster sleeve 102 and inner retractor cage 104 together form the complete frame subassembly 100. To this end, retractor cage 104 is disposed inside of thruster sleeve 102. More specifically, retractor cage 104 is disposed so that its side risers 134 and crossbar 136 reside inside the sleeve's axial bore 116, with crossbar 136 residing in the upper portion of the sleeve's body section 106, below the sleeve's upper flange 108. The cage's base 138 is disposed so that its plug 150 extends up into the sleeve's body section 106, and its flange 154 engages the sleeve's lower flange 110, with the cage's flange surface 158 seating against the sleeve's flange surface 114 so as to compressively captivate O-ring seal 128 in working position. Screws 170 are disposed in the cage's flange holes 168 and the sleeve's flange holes 132 to lock retractor cage 104 in position relative to thruster sleeve 102.

Figure 4:
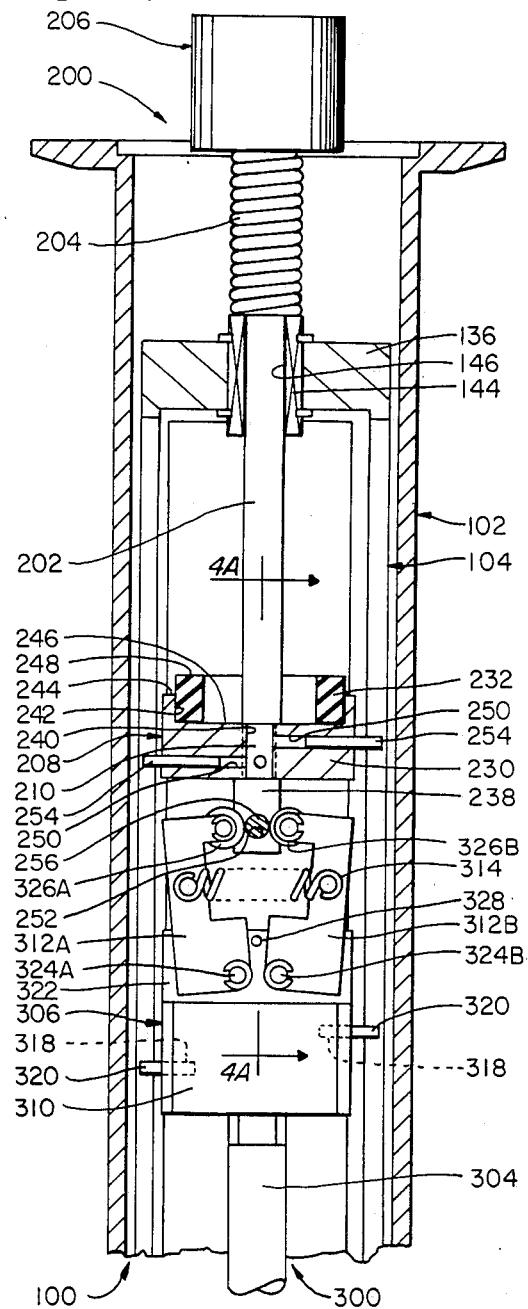
FIG. 4 is an enlarged partial side elevational view partially in section showing the preferred embodiment's chip thruster assembly, with the chip thruster assembly's chip carrier subassembly being shown in its second retracted position.
Figure 4A:
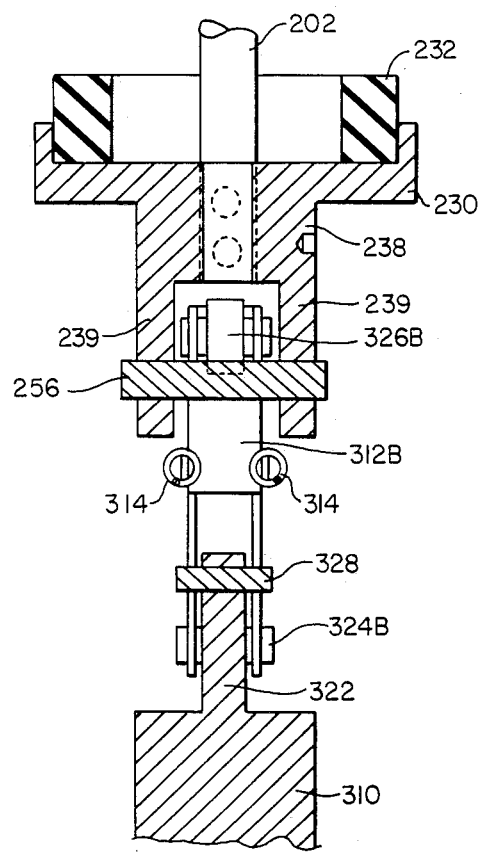
FIG. 4A is a sectional view taken along line 4A—4A of FIG. 4.

Looking next at FIGS. 2, 4 and 4A, chip carrier subassembly 200 is movably mounted to frame subassembly 100. Chip carrier subassembly 200 comprises a thrust rod 202, a compression spring 204, a chip cup 206 attached to the upper end of rod 202, and a draw block unit 208. Thrust rod 202 is slidably disposed in the bearing unit's central opening 146. Rod 202 has a threaded axial bore (not shown) at its top end, and a threaded reduced-diameter extension 210 at its bottom end. Compression spring 204 is coiled around rod 202, with its bottom end engaging the top surface of bearing unit 144 and its top end engaging the underside of cup 206. Chip cup 206 (FIG. 2) defines a chip receiving chamber 212 and its bottom wall 214 has a center hole 216 formed with upper and lower counterbores 218 and 220. A shoulder 222 is formed at the intersection of counterbore 218 and center hole 216. A second shoulder 224 is formed at the intersection of hole 216 and lower counterbore 220. Chip cup 206 is attached to the upper end of thrust rod 202 by positining the bottom end of the cup against the top surface of the thrust rod, so that the cup's central bore 216 is axially aligned with the threaded axial bore (not shown) formed in the top end of the rod. Then a screw 228 is used to secure the chip cup to the rod, with the head of the screw being disposed in the cup's upper counterbore 218 and engaging the cup's shoulder 222, and the threaded shank of the screw passing through hole 216 and being screwed into the rod's top threaded axial bore (not shown). The top end of compression spring 204 seats itself in the chip cup's bottom counterbore 220 against shoulder 224 when chip cup 206 is attached to thrust rod 202 in the foregoing manner.

The bottom end of thrust rod 202 is attached to draw block unit 208 (FIGS. 4 and 4A). Draw block unit 208 comprises a draw block 230, and a draw block bumper element 232. Draw block 230 is generally cylindrical in shape, and includes a reduced-diameter lower section 238 terminating in a pair of tabs 239 (FIG. 4A) separated by a recess. An axial bore 240 and an axial counterbore 242 extend downward from the draw block's upper surface 244. A shoulder 246 is formed at the intersection of bore 240 and counterbore 242. Bore 240 is threaded. Draw block bumper element 232 is in the form of an annular ring or washer, and is made out of a resilient material, preferably an elastomer such as rubber. Bumper element 232 is formed so that it has an outer diameter (in its uncompressed state) which is slightly greater than the diameter of the draw block's counterbore 242, so that the bumper element may be force fitted into the counterbore and securely maintained there. Bumper element 232 is also formed so that it has a height (in its uncompressed state) which is slightly greater than the depth of the draw block's counterbore 242, so that when the bumper element is properly seated in the counterbore against the draw block's shoulder 246, the bumper element's top surface 248 will extend out above the upper surface 244 of draw block 230, as shown in FIGS. 4 and 4A. Draw block 230 also includes a pair of diametrically-opposed radial holes 250, and a pair of aligned radial holes 252 extending through the tabs 239 formed in the block's reduced-diameter cylindrical lower section 238. Radial holes 250 extend at right angles to radial holes 252. A guide pin 254 is secured in and extends outward from each of the radial holes 250, and a pin 256 is secured in the radial holes 252 so that it extends across the recess disposed between tabs 239 (FIG. 4A).

Draw block unit 208 is attached to the bottom end of thrust rod 202 by screwing the rod's threaded extension 210 into the draw block's threaded bore 240. Attachment is effected so that the draw block's radial holes 250 are aligned with the cage's longitudinal slots 140. Guide pins 254 are then inserted into the radial holes 250 so that the pins project out of the draw block and into the cage's longitudinal slots 140. As a consequence of the foregoing construction, when thrust rod 202 is reciprocated up and down in central opening 146 of bearing unit 144, guide pins 254 will move up and down along the cage's vertical slots 140 so as to keep the bottom end of chip carrier subassembly 200 aligned within frame subassembly 100.

It is to be appreciated that the various members of chip carrier subassembly 200 are appropriately sized relative to one another so that spring 204 is always in a state of at least some compression. As a result, spring 204 is always working to urge chip cup 206 upward away from the cage's crossbar 136 and, as a consequence thereof, to urge draw block unit 208 upward into engagement with the cage's crossbar 136, in the manner shown in FIG. 2. This is the chip carrier subassembly's normal "at rest" position and, for convenience of description, will hereinafter be referred to as the chip carrier subassembly's first extended position. At the same time, it is also to be appreciated that the various members of chip carrier subassembly 200 are appropriately sized relative to one another so as to allow the subassembly 200 to be drawn downward against the power of spring 204 so that chip cup 206 advances towards cage crossbar 136 and draw block unit 208 retreats away from cage crossbar 136, in the manner shown in FIG. 4. This is the chip carrier subassembly's abnormal "tensed" position and, for convenience of description, will hereinafter be referred to as the chip carrier subassembly's second retracted position. Of course, it is also to be appreciated that as soon as the force holding the chip carrier subassembly in its second retracted position is terminated, the chip carrier subassembly will immediately snap back upward into its first extended position wherein bumper element 232 engages cage crossbar 136.

Retractor subassembly 300 is adapted to releasably retract chip carrier subassembly 200 upon command. Looking next at FIGS. 2, 3, 4, and 4A, retractor subassembly 300 comprises a pneumatic actuator 302 having a piston or actuator rod 304, and a retractor block unit 306. Actuator 302 is attached to retractor cage 104 by screwing the actuator housing into the cage's threaded opening 162, whereby the actuator's body will be secured to the cage while the actuator's rod 304 will be free to reciprocate upward and downward within cage 104 in response to the application of pressurized air to one or the other of the actuator's fittings 308A, 308B, respectively. When actuator 302 is secured to cage 104 in the foregoing manner, O-ring seal 166 is compressively captivated between the two members so as to form a tight seal.

Retractor block unit 306 in turn comprises a retractor block 310, a pair of jaws 312, and a pair of springs 314. Block 310 has a threaded blind hole 316 (FIG. 2) formed in its bottom side, in which is screwed the threaded free end of actuator rod 304. This secures the retractor block unit 306 to actuator rod 304, whereby block unit 306 will reciprocate upward and downward within cage 104 according to the action of pneumatic actuator 302. To keep retractor block unit 306 properly aligned within cage 104 as it reciprocates upward and downward, retractor block 310 has a pair of diametrically-opposed radial holes 318 and a pair of guide pins 320 (FIG. 4). Guide pins 320 are secured in radial holes 318 and project outward therefrom into the cage's longitudinal slots 140 (FIG. 2A). Pins 320 ride in slots 140 and thereby guide the retractor block unit as it moves upward and downward within cage 104.

Retractor block 310 is cut back in width at its upper end so as to form a tongue portion 322 (FIGS. 2A, 4 and 4A). Jaws 312 are rotatably pinned to the block's tongue portion 322 via two pivot pins 324. Jaw 312A is pivotally mounted to tongue 322 by pivot pin 324A, and jaw 312B is pivotally mounted to tongue 322 by pivot pin 324B. Jaws 312A and 312B are located in confronting relation to one another so as to form a jaw pair. Attached to jaws 312A and 312B are stub shafts 327A and 327B that rotatably support rollers 326A and 326B. A pair of tension springs 314 are attached to jaws 312A and 312B so as to urge the two jaws toward one another. A pin 328 is disposed in the retractor block's tongue portion 322. Pin 328 is diametrically sized so as to impede the closure of jaws 312 to the point where rollers 326A and 326B may approach but never quite touch one another under the influence of springs 314.

Retractor subassembly 300 is sized relative to the other members of chip thruster assembly 4 so that (a) when actuator 302 is operated by the application of pressurized air to its fitting 308A so as to extend its actuator arm 304 as far upward as possible, jaw rollers 326 will be disposed between crossbar 136 and the dowel 256, and the chip carrier subassembly 200 will be disposed in its first extended position in the manner shown in FIG. 2, and (b) when actuator 302 is operated by the application of pressurized air to its fitting 308B so as to retract its actuator arm 304 as far downward as possible, the bottom end of retractor block 310 will engage, or nearly engage, the upper surface 156 of cage plug 138.

Figure 3:
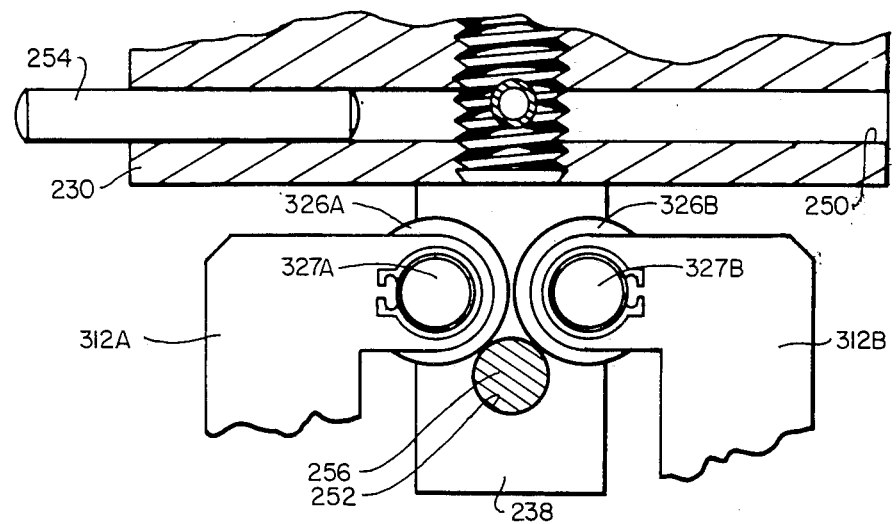
FIG. 3 is an enlarged side elevational view partially in section of a selected portion of the chip thruster assembly.

On account of the foregoing construction, if the chip thruster assembly 4 is in the position shown in FIGS. 2 and 3 (i.e., chip carrier subassembly 200 is in its first extended position with the top surface 248 of draw block bumper 232 engaging cage crossbar 136, and retractor subassembly 300 is set so that its actuator arm 304 is extended as far upward as possible, and jaw rollers 326 engage one another above draw block dowels 256), and actuator 302 is then operated by the application of pressurized air to its fitting 308B so as to cause it to retract its actuator rod 304 downward, the force of jaw springs 314 will initially be sufficient to maintain the roller of jaw 312A in near engagement with the roller of jaw 312B, so that the descending retractor block unit 306 will draw dowel 256 (and hence chip carrier subassembly 200) downward into frame subassembly 100, against the power of spring 204. As chip carrier subassembly 200 is pulled further and further downward into frame subassembly 100, its spring 204 is compressed more and more, so that it generates greater and greater upward force. As the chip carrier subassembly reaches its second retracted position, the energy stored in spring 204 will finally be sufficient to overcome the power of jaw springs 314. Jaw 312A thereupon parts sufficiently from jaw 312B to allow pin 256 to pass between them (FIG. 4), and compression spring 204 takes over completely to drive chip carrier subassembly 200 upward towards its first extended position. Chip carrier subassembly 200 will move upward under the influence of spring 204 until it reaches its first extended position, whereupon the bumper element's upper surface 248 strikes the bottom side of cage crossbar 136 to abruptly halt the upward movement of the chip carrier subassembly 200. The rapid deceleration of chip carrier subassembly 200 will cause any loose chips contained in chip cup 206 to be thrown upward, out of the cup. In the meantime, as soon as the draw block's pin 256 has passed by jaw rollers 326, jaw springs 314 cause the jaws to snap shut once again, and actuator 302 will continue retracting its arm 304 as far downward as possible. Thereafter, the retractor subassembly 300 may be returned to the position shown in FIG. 2 simply by operating pneumatic actuator 302 by the application of pressurized air to its fitting 308A, whereupon actuator 302 will extend its arm 304 upward once again so that the rising jaws 312 of retractor block unit 306 will first encounter and then pass by the chip carrier subassembly's pin 256, as jaws 312 first part and then close again under the action of jaw springs 314 and the jaws' interaction with pin 256.

It is to be appreciated that by coordinating the relative length and strength of spring 204 of chip carrier subassembly 200 with the relative lengths and strengths of jaw springs 314, the point at which jaws 322 part and the chip carrier subassembly 200 is released to the full effect of spring 204 (i.e., the chip carrier subassembly's "release point") may be specified with some precision. As a result, it is possible to regulate fairly precisely the force with which any chips contained in chip cup 206 will be thrown upward away from chip thruster assembly 4. The point at which jaws 322 part may also be regulated by varying the relative positions of jaw springs 314 on jaws 312, e.g. the point at which the jaws part can be delayed by positioning jaw springs 314 higher up on jaws 312.

Figure 5:
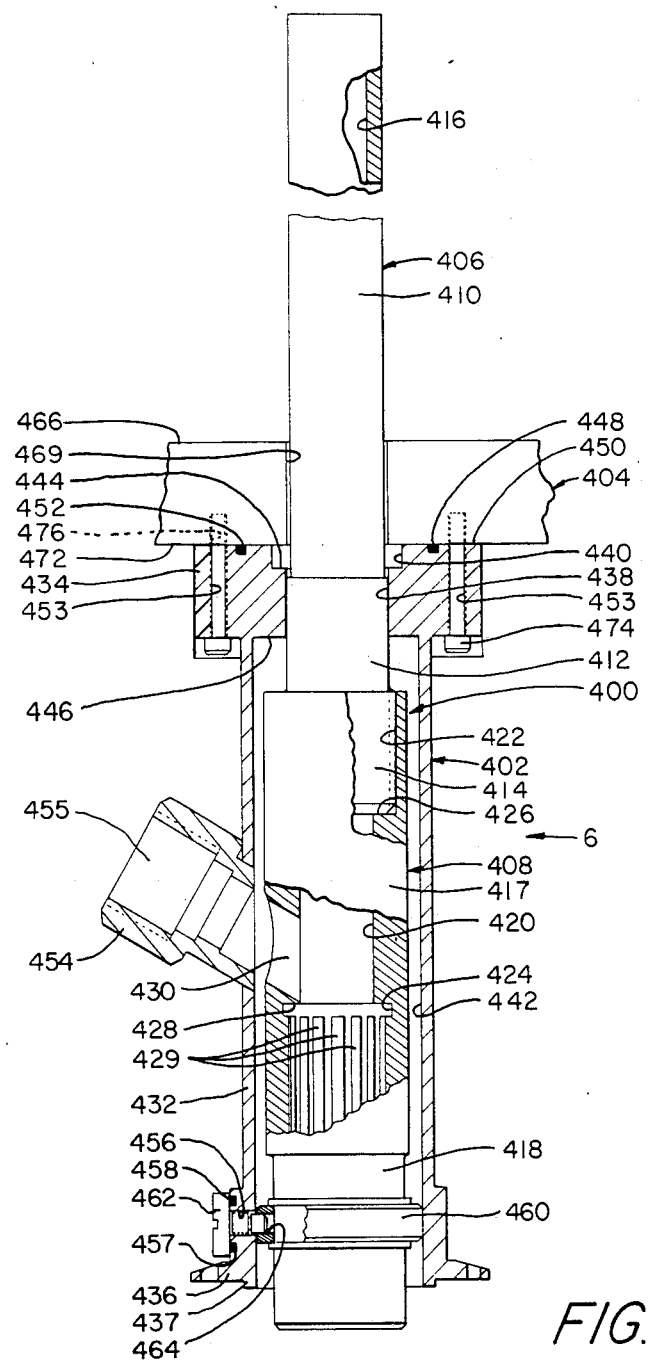
FIG. 5 is an enlarged partial side elevational view partially in section of the preferred embodiment's base plate assembly.

Looking next at FIGS. 1 and 5, melt replenishing apparatus 2 also comprises the base plate assembly 6. Base plate assembly 6 in turn comprises a feed tube 400, a thruster sleeve 402, and a base plate 404.

Feed tube 400 comprises a top cylindrical member 406 and a bottom cylindrical member 408. Top member 406 has a stepped exterior surface, having a larger diameter at its bottom end than at its top end. More particulary, top member 406 comprises a first diameter upper portion 410, a larger diameter intermediate portion 412 and a still larger diameter bottom portion 414. The exterior of bottom portion 414 is threaded. The feed tube's top member 406 has an interior axial bore 416 of constant dimension. The feed tube's bottom member 408 also has a stepped exterior surface. More particularly, the feed tube's bottom member 408 comprises a first diameter upper portion 417 and a smaller diameter lower portion 418. The feed tube's bottom member 408 also includes an axial bore 420, an upper axial counterbore 422 and a lower axial counterbore 424. Axial bore 420 intercepts upper axial counterbore 422 at a shoulder 426, and axial bore 420 intercepts lower axial counterbore 424 at a shoulder 428. The surface defining lower axial counterbore 424 is formed with a plurality of ribs 429. Upper counterbore 422 is threaded, and the feed tube's top member 406 is joined to the feed tube's bottom member 408 by screwing the top member into the bottom member's upper counterbore 422. Hence, the two members 406 and 408 form a single feed tube 400. The feed tube's bottom member 408 has a side opening 430 which communicates with its interior.

Thruster sleeve 402 comprises a cylindrical body section 432, an upper flange 434, a stepped lower flange 436, and a bottom lip or projection 437. A central bore 438, an upper counterbore 440 and a lower counterbore 442 pass lengthwise through the sleeve. Central bore 438 and upper counterbore 440 form a shoulder 444, and bore 438 and lower counterbore 442 form a shoulder 446. A circular top groove 448 is formed in the sleeve's top end surface 450 and accommodates a resilient O-ring seal 452. A plurality of threaded holes 453 are provided in upper flange 434. A side port fitting 454 providing a source material delivery port 455 is attached to the sleeve's cylindrical body section 432 so that the delivery port communicates with the interior of the sleeve. A radially-extending lower port or opening 456 is formed in the stepped lower flange 436 and also communicates with the interior of the sleeve. A circular side groove 457 is formed in the outer surface of the stepped lower flange surrounding lower port 456, and a resilient O-ring seal 458 is disposed in groove 457.

Feed tube 400 is mounted to thruster sleeve 402 by passing the assembled feed tube up into the sleeve so that the feed tube's top member 406 makes a fit in the sleeve's bore 438 and the feed tube's bottom member 408 extends along the inside of the sleeve's bottom counterbore 442. Feed tube 400 is positioned in elevator thruster sleeve 402 so that the feed tube's side opening 430 is aligned with the sleeve's side port 455. Feed tube 400 is secured in this position by fitting a collar 460 around the feed tube's bottom portion 418, and then screwing a screw 462 into thruster sleeve opening 456 so that the screw's leading tip is received in an appropriate opening 464 formed in collar 460. It is to be appreciated that when screw 462 is disposed in the sleeve's lower opening 456 in the foregoing manner, it will engage and compress sleeve seal 458 sufficiently to render thruster sleeve opening 456 airtight. It is also to be appreciated that when feed tube 400 and thruster sleeve 402 are joined in the foregoing manner, the bottommost portion of feed tube 400 will extend slightly beyond the thruster sleeve's bottom lip 437, in the manner shown in FIG. 5.

Base plate 404 essentially provides a base or support for the remainder of the base plate assembly, and to this end it has a top surface 466, a smooth central bore 469, and a bottom surface 472.

The assembled feed tube 400 and thruster sleeve 402 are attached to base plate 404 by passing the top end of feed tube 400 up through base plate bore 469 until the sleeve's upper flange 434 is positioned against the base plate, with the sleeve's uppermost surface 450 engaging the base plate's bottom surface 472. Screws 474 are passed through flange holes 453 and into corresponding holes 476 formed in base plate 404 to secure the members to one another. It is to be appreciated that when sleeve 402 is secured to plate 404 in the foregoing manner, O-ring seal 452 is compressively captivated between the two members in working position.

Chip thruster assembly 4 and base plate assembly 6 are assembled together in the manner shown in FIG. 1 so as to form the complete melt replenishing apparatus 2. More particularly, chip thruster assembly 4 and base plate assembly 6 are assembled together by bringing the top end of chip thruster assembly 4 up against the bottom end of base plate assembly 6, so that the top flange 108 (FIG. 2) of the chip thruster assembly's sleeve 102 engages the bottom flange 436 (FIG. 5) of the base plate assembly's sleeve 402, with the bottom lip 437 of the base plate assembly slipping into counterbore 118 of the chip thruster assembly. As chip thruster assembly 4 and base plate assembly 6 come together in this way, the chip thruster assembly's O-ring seal 126 is compressed between the two assemblies so as to make the unification airtight. When chip thruster assembly 4 and base plate assembly 6 are assembled together in the foregoing manner, the bottommost portion of the base plate assembly's feed tube 400 extends down into the interior of the chip thruster assembly's thruster sleeve 102, and chip cup 206 extends up into the bottom end of the feed tube. It is to be appreciated that the various parts of the two assemblies are appropriately sized relative to one another so that (a) chip cup 206 always resides below the base plate assembly's source material delivery port 430, regardless of whether the chip carrier subassembly 200 is in its aforementioned first extended position or its aforementioned second retracted position, whereby chips of source material admitted to the interior of feed tube 400 via delivery ports 455 and 430 will always make their way under gravity down into chamber 212 of chip cup 206, and (b) chip cup 206 always resides inside feed tube 400, regardless of whether the chip carrier subassembly 200 is in its aforementioned first extended position or its aforementioned second retracted position.

Relating the specific construction of melt replenishing apparatus 2 to the foregoing section entitled "Summary Of The Invention", sleeves 102 and 402 and feed tube 400 comprise the housing of the melt replenishing apparatus, chip carrier subassembly 200 comprises the means for supporting a predetermined charge of source material which is to be added to the melt, ports 455 and 430 comprise the conduit means for delivering a predetermined charge of source material to the support means, spring 204 yieldably biases the support means upward within the housing, crossbar 136 acts as stop means for preventing the support means from passing out the top end of the housing, and retractor subassembly 300 functions as the means for retracting the support means on command downward within the housing.

Figure 6:
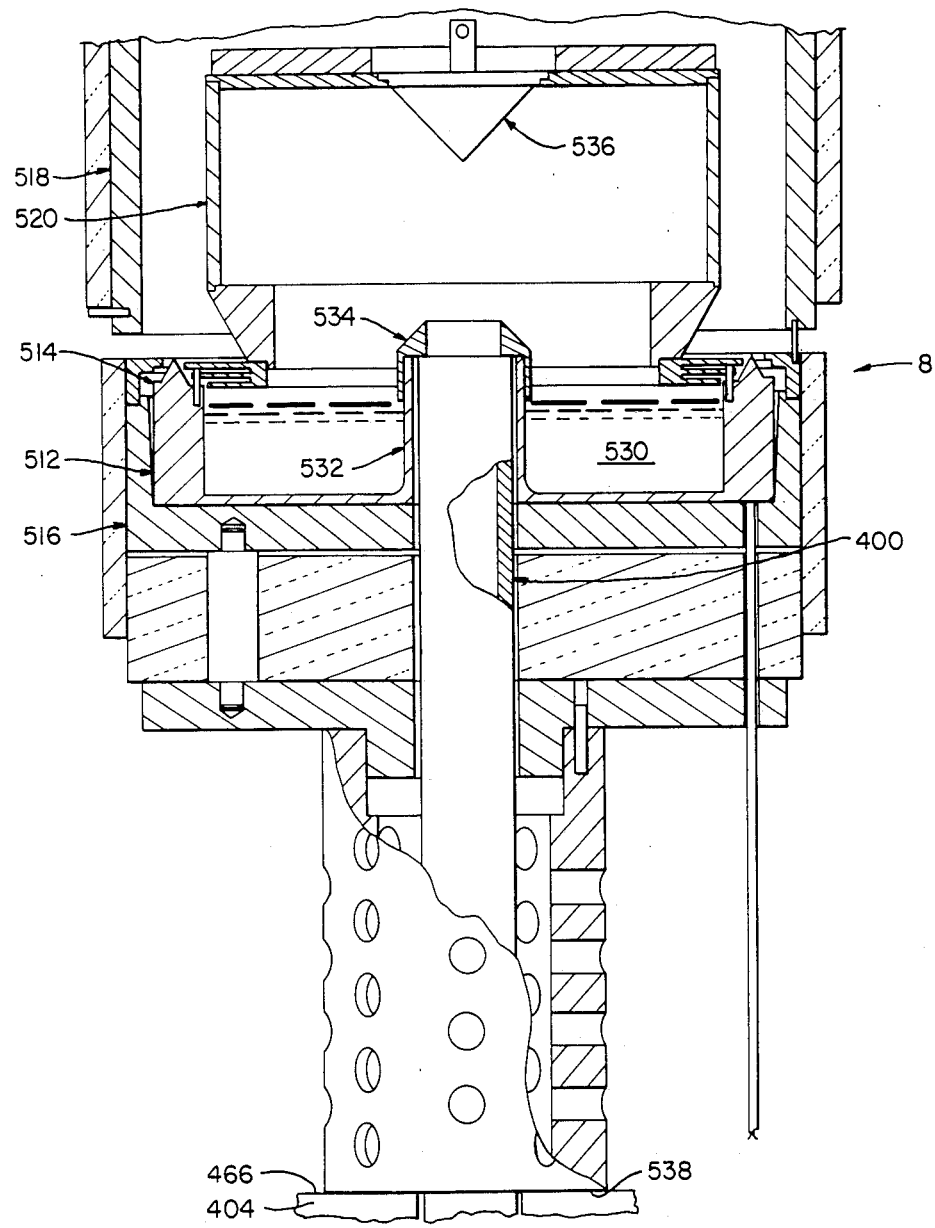
FIG. 6 is an enlarged partial side elevational view partially in section showing a portion of the preferred embodiment's base plate assembly in association with apparatus for growing crystalline bodies according to the EFG Process.

Looking next at FIGS. 1 and 6, melt replenishing apparatus 2 is intended to be used in cooperation with crystal growing apparatus 8. Crystal growing apparatus 8 is of the sort well known in the art, and is substantially like the crucible and die arrangements described and illustrated in U.S. Pat. Nos. 4,230,674 and 4,440,728, except for a number of differences which will hereinafter be described in detail. Essentially, crystal growing apparatus 8 comprises a crucible 512, a capillary die 514, a heat susceptor 516, an outer after-heater assembly 518 and an inner after-heater assembly 520. In use, crucible 512 is loaded with a charge 530 of the material which is to be grown (e.g. silicon, alpha-aluminum, and the like).

Crucible 512 differs from the crucible shown in U.S. Pat. No. 4,440,728 in that it has a hollow central riser or chimney 532 (FIG. 6) rising up through its middle. Riser 532 is preferably, though not necessarily, formed integral with the remainder of the crucible, and has a rim cap 534 set on its top. In addition, inner after-heater assembly 520 differs somewhat from the inner after-heater shown in U.S. Pat. No. 4,440,728 in that it has a conical chip deflector 536 mounted at its center, directly over chimney 532.

Still looking at FIGS. 1 and 6, melt replenishing apparatus 2 is united with the crystal growing apparatus 8 by having the melt replenishing apparatus' feed tube 400 extend up into the interior of crucible chimney 532, with the top surface 466 of base plate 404 engaging and supporting the bottom surface 538 of crystal growing apparatus 8.

Operation of melt replenishing apparatus 2 will now be described.

Apparatus 2 is initially prepared for use by coupling its side port fitting 454 (FIG. 5) to a storage bin (not shown) containing an ample supply of source material chips. This coupling is done so that a gating mechanism (not shown) is interposed between the bin and port fitting 454 to regulate the frequency at which chips will be fed from the storage bin to the port fitting 454. The particular construction of the aforementioned storage bin and gating mechanism is not critical to this invention, and they may be made according to various designs known in the art. Therefore, they need not now be described in detail in order to understand the design and operation of the present invention. Once the coupling has been made, pressurized air is applied to actuator fitting 308A to cause actuator 302 to extend its arm 304 as far upward as posssible, so that the chip thruster assembly 4 assumes the position shown in FIGS. 1 and 2.

Thereafter, when it is desired to utilize melt replenishing apparatus 2 to recharge the melt 530 contained in crucible 512, the gating means (not shown) for the storage bin (also not shown) is actuated so as to release a predetermined quantity, or charge, of source material chips from the bin. These chips pass through delivery ports 455 and 430 into chip cup 206. Then actuator 302 is stimulated via the application of pressurized air to its fitting 308B to cause it to retract its actuator rod 304 downward, so that the retreating retractor block unit 306 will draw chip carrier subassembly 200 downward, against the force of spring 204. When the chip carrier subassembly 200 has been drawn down to its aforementioned release point, the draw block subassembly's jaws 312 part to release the chip carrier subassembly 200, whereupon the latter is driven upward under the full power of spring 204. Chip carrier subassembly 200 moves upward until it reaches its first extended position, whereupon its bumper element 232 engages cage crossbar 136 so as to abruptly halt the upward movement of the chip carrier subassembly. This causes the source material chips contained in chip cup 206 to pop upward, out the top of chip cup 206 and out the top of crucible chimney 532. These chips strike chip deflector 536 and thereafter drop into the melt, thereby replenishing it.

The foregoing action is repeated as often as it is desired to replenish the melt with additional source material chips.

It is to be appreciated that, by carefully adjusting the frequency at which the apparatus 2 replenishes the melt, melt 530 can be replenished at substantially the same rate at which it is consumed by the crystal growing operation.

MODIFICATION OF THE PREFERRED EMBODIMENT

It is, of course, possible to modify the preferred embodiment of the invention without departing from the scope of the invention. Thus, for example, chip cup 206 could be formed as a simple planer platform which makes a close sliding fit with the interior walls of feed tube 400, rather than with the cup-like geometry as disclosed above. Then source material chips fed to chip carrier subassembly 200 would simply rest on the platform prior to deployment into the melt, with the close sliding fit formed between the chip platform and feed tube 400 preventing the chips from falling down below the platform. Or feed tube 400 could be formed out of only one member, rather than the two members shown.

These and other changes of their type will be obvious to persons skilled in the art, and are considered to be within the scope of the present invention.

ADVANTAGES OF THE INVENTION

Use of the present invention yields a number of advantages.

First, the present invention provides novel apparatus for replenishing a melt which is adapted to replenish the melt while a crystal growing operation is under way, so that the crystal growing operation can continue without interruption for longer periods of time.

Second, the present invention provides novel apparatus for replenishing a melt in a crucible at substantially the same rate at which the melt is consumed during a crystal growing operation in order that the melt level in the crucible may be kept substantially constant during crystal growth to facilitate growing high quality crystal.

Third, the present invention provides novel apparatus for replenishing a melt which is simple to construct, inexpensive to produce, and reliable to operate.

Fourth, the present invention provides novel apparatus for replenishing a melt which can be used in conjunction with apparatus for growing crystalline bodies according to the EFG Process, as well as in conjunction with apparatus for growing crystalline bodies according to other processes.

Fifth, the present invention provides novel apparatus for replenishing a melt which is adapted to operate from a position inside a hollow crystalline body as the body is being grown from the melt.

And sixth, the present invention provides novel melt replenishment apparatus for use with a conventional crystal growing furnace in which a predetermined gaseous environment must be maintained.

Still other advantages associated with practicing the present invention will be obvious to persons skilled in the art.

What we claim is:

1. In combintaion with a crucible for containting a melt, apparatus for replenishing the melt, said apparatus comprising:
   (a) a hollow housing having a top end and a bottom end, said top end being open;
   (b) support means within said housing for supporting source material which is to be added to a melt, said support means being vertically movable within said hollow housing;
   (c) means for delivering a predetermined charge of source material to said support means;
   (d) first spring means for urging said support means toward said open top end of said housing;
   (e) stop means for preventing said support means from passing out said top end of said housing; and
   (f) retractor means for (a) retracting said support means downward within said housing against the force of said first spring means until said support means reaches a predetermined release point, and
   (b) automatically releasing said support means when said release point is reached, whereby the force of said first spring means will drive said support means upward within said housing until said support means encounters said stop means, whereupon said support means will abruptly stop and source material supported on said support means will be thrown upward out of said housing for delivery into a melt contained within said crucible.

2. Apparatus according to claim 1 wherein said crucible has an opening, and further wherein said open top end of said housing extends into said crucible opening, whereby source material thrown upward out of said housing will be cast into said crucible to replenish a melt therein.

3. Apparatus according to claim 1 wherein said support means comprises a cup-shaped recepticle for holding source material.

4. Apparatus according to claim 1 wherein said support means comprises a coupling member which is releasably engaged by said retractor means until said support means reaches said release point, and thereafter is released by said retractor means.

5. Apparatus according to claim 4 wherein said retractor means comprises two jaw members movable toward and away from one another, and second spring means for urging said jaw members toward one another so as to engage said coupling member, and further wherein said second spring means are configured to (a) hold said jaw members closed in engagement with said coupling member so as to permit said retractor means to retract said support means downward within said housing, and (b) allow said jaw members to separate to release said coupling member when said release point is reached, so as to release said support means for upward movement within said housing under the influence of said first spring means.

6. Apparatus according to claim 5 wherein said retractor means comprises a pneumatic actuator.

7. Apparatus for use in growing crystalline bodies from a melt of selected source material, said apparatus comprising:
  (a) a crucible for containing a supply of liquid material;
  (b) a hollow housing having a top end and a bottom end, said top end being open, said hollow housing being disposed in said crucible so that said top end of said housing resides above the upper surface of a melt contained therein;
  (c) support means within said housing for supporting source material which is to be added to a melt, said support means being vertically movable within said hollow housing;
  (d) means for delivering a predetermined charge of source material to said support means;
  (e) first spring means for urging said support means toward said open top end of said housing;
  (f) stop means for preventing said support means from passing out said top end of said housing; and
  (g) retractor means for (a) retracting said support means downward within said housing against the force of said first spring means until said support means reaches a predetermined release point, and (b) automatically releasing said support means when said release point is reached, whereby the force of said first spring means will drive said support means upward within said housing until said support means encounters said stop means, whereupon said support means will abruptly stop and source material supported on said support means will be thrown upward out of said housing for delivery into a melt contained within said crucible.

8. Apparatus for replenishing a melt comprising:
  (a) a hollow housing having a top end and a bottom end, said top end being open;
  (b) support means within said housing for supporting source material which is to be added to a melt, said support means being vertically movable within said hollow housing and comprising a coupling member;
  (c) means for delivering a predetermined charge of source material to said support means;
  (d) first spring means for urging said support means toward said open top end of said housing;
  (e) stop means for preventing said support means from passing out said top end of said housing; and
  (f) retractor means for (a) retracting said support means downward within said housing against the force of said first spring means until said support means reaches a predetermined release point, and (b) automatically releasing said support means when said release point is reached, whereby the force of said spring means will drive said support means upward within said housing until said support means encounters said stop means, whereupon said support means will abruptly stop and source material supported on said support means will be thrown upward out of said housing for delivery into a melt, said retractor means comprising two jaw members movable toward and away from one another and second spring means for urging said jaws members towards one another so as to engage said coupling member, and said second spring means being configured to (a) hold said jaw members closed in engagement with said coupling member so as to permit said retractor means to retract said support means downward within said housing, and (b) allow said jaw members to separate and free said coupling member when said release point is reached, so as to release said support means for upward movement within said housing under the influence of said second spring means.

9. Apparatus according to claim 8 wherein said support means comprises a cup-shaped recepticle for holding source material.

* * * * *